United States Patent
Hsin et al.

(10) Patent No.: US 9,725,312 B1
(45) Date of Patent: Aug. 8, 2017

(54) PRECONDITIONING TO ENHANCE HYDROPHILIC FUSION BONDING

(71) Applicant: Taiwan Semiconductor Manufacturing Co., Ltd., Hsin-Chu (TW)

(72) Inventors: Chien-Ning Hsin, Hsinchu (TW); I-Shi Wang, Sanxia Township (TW); Jen-Hao Liu, Zhunan Township (TW); Chih-Hang Chang, Taoyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/016,527

(22) Filed: Feb. 5, 2016

(51) Int. Cl.
H01L 21/76 (2006.01)
B81C 1/00 (2006.01)
H01L 21/02 (2006.01)

(52) U.S. Cl.
CPC .... B81C 1/00357 (2013.01); H01L 21/02334 (2013.01); H01L 21/02337 (2013.01); *B81C 2203/037* (2013.01)

(58) Field of Classification Search
CPC ......... H01L 21/02337; H01L 21/02334; B81C 1/00357; B81C 203/037
USPC ....................................................... 438/406
See application file for complete search history.

(56) References Cited

U.S. PATENT DOCUMENTS

| 2008/0286939 A1* | 11/2008 | Ohnuma | H01L 21/2007 438/458 |
| 2008/0296724 A1* | 12/2008 | Yamazaki | H01L 21/76254 257/506 |
| 2008/0311726 A1* | 12/2008 | Ohnuma | H01L 21/76259 438/455 |
| 2012/0043647 A1* | 2/2012 | Gaudin | H01L 21/2007 257/618 |

OTHER PUBLICATIONS

Sabreen, Scott. "Cold Gas Plasma Surface Modification—Optimize Plastics Bonding Adhesion." Adhesion Bonding. Published Apr. 30, 2012.
Suni, T., et al. "Effects of Plasma Activation on Hydrophilic Bonding of Si and SiO2." Journal of the Electrochemical Society, 149 (6) G348-G351 2002. Published Apr. 25, 2002.
Suni, Tommi."Direct Wafer Bonding for MEMS and Microelectronics." VTT Publications. Published Aug. 18, 2006.

* cited by examiner

*Primary Examiner* — David S Blum
(74) *Attorney, Agent, or Firm* — Eschweiler & Potashnik, LLC

(57) ABSTRACT

A method for fusion bonding a pair of substrates together with silane preconditioning is provided. A surface of a first oxide layer or a surface of a second oxide layer is preconditioned with silane. The first and second oxide layers are respectively arranged on first and second semiconductor substrates. Water is applied to the surface of the first or second oxide layer. The surfaces of the first and second oxide layers are brought in direct contact. The first and second oxide layers are annealed. A method for manufacturing a microelectromechanical systems (MEMS) package using the fusion bonding is also provided.

20 Claims, 12 Drawing Sheets

1

PRECONDITIONING TO ENHANCE HYDROPHILIC FUSION BONDING

BACKGROUND

Fusion bonding (also known as direct bonding) is a process for joining surfaces without intermediate layers. The process is based on the formation of chemical bonds between the surfaces when the surfaces are sufficiently flat, clean, and smooth. Fusion bonding has many applications in the semiconductor manufacturing industry. For example, fusion bonding may be used to package microelectromechanical systems (MEMS) devices, such as accelerometers, pressure sensors, and gyroscopes, or to manufacture semiconductor substrates, such as silicon-on-insulator (SOI) substrates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
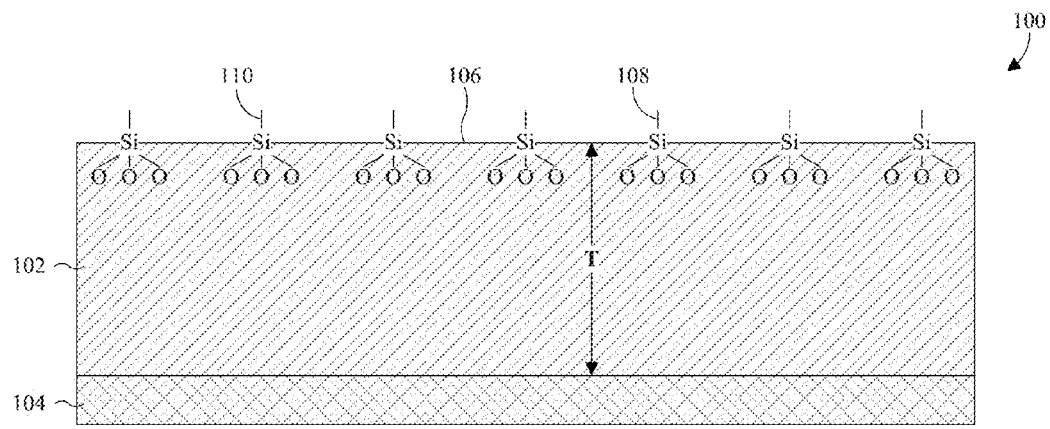
FIGS. 1-9 illustrate a series of cross-sectional views of some embodiments of a method for fusion bonding a pair of substrates together with silane preconditioning.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some microelectromechanical systems (MEMS) devices are packaged according to a process that utilizes an epitaxial deposition. In such a process, a recess is formed in a silicon substrate, a first oxide layer is formed lining the silicon substrate and the recess, and the recess is filled with a second oxide layer. A chemical mechanical polish (CMP) is performed into the second oxide layer to coplanarize upper surfaces of the oxide layers, and a silicon layer is formed by epitaxy over the silicon substrate and the oxide layers. With the silicon layer formed, a first etch is performed to form an opening exposing the second oxide layer and a second etch is performed to remove the second oxide layer through the opening. However, this approach to packaging MEMS devices is complicated and requires an expensive photomask for exposing the second oxide layer.

Other MEMS devices are packaged according to a process that utilizes fusion bonding. In such a process, a recess is formed in a first silicon substrate, and a first oxide layer is formed lining the silicon substrate and the recess. A second silicon substrate is arranged over the first silicon substrate and the first oxide layer, and is fusion bonded to the first silicon substrate through the first oxide layer. During fusion bonding, a surface of a second oxide layer of native oxide on the second substrate is activated, and the surface of the second oxide layer or a surface of the first oxide layer is covered in water. The surfaces of the first and second oxide layers are then brought into contact and annealed.

While the fusion-bonding approach can be performed with one less photomask than the epitaxial approach, the strength of the bond may be weak due to a low density of silanol groups on the surface of the first or second oxide layer. This may, in turn, lead to peeling when thinning the second silicon substrate and/or when the non-bond area (e.g., the recess) is large. Further, the wafer-to-wafer (W2W) uniformity of the bond may be low, thereby leading to poor yields during bulk manufacture.

The present application is directed to a method for fusion bonding a pair of substrates together with silane preconditioning. In some embodiments, a surface of a first oxide layer or a surface of a second oxide layer is preconditioned with silane. The first and second oxide layers are respectively arranged on first and second semiconductor substrates. Water is applied to the surface of the first or second oxide layer, and the surfaces of the first and second oxide layers are arranged in direct contact. With the surfaces of the first and second oxide layers in direct contact, the first and second oxide layers are annealed. Advantageously, by preconditioning the surface of the first or second oxide layer with silane, the density of silanol groups on the surface is high. This, in turn, results in a strong bond and a low likelihood of peeling (i.e., bond failure). Further, by preconditioning the surface of the first or second oxide layer with silane, the density of silanol groups on the surface is substantially uniform between workpieces during bulk manufacture. This, in turn, results in good W2W uniformity and yield.

With reference to FIGS. 1-9, a series of cross-sectional views 100-900 illustrate some embodiments of a method for fusion bonding a pair of substrates together with silane preconditioning. As will be seen, the silane preconditioning advantageously increases silanol groups for increased hydrophilicity and bond strength.

As illustrated by the cross-sectional view 100 of FIG. 1, a first oxide layer 102 is formed on a first semiconductor substrate 104. In some embodiments, the first oxide layer 102 is formed directly on the first semiconductor substrate 104 and/or with a thickness T exceeding about 50 nanometers. The first oxide layer 102 comprises a surface 106 that is on an opposite side of the first oxide layer 102 as the first semiconductor substrate 104 and that has vacant silicon bond sites 108, 110 (i.e., dangling silicon bonds). The first oxide layer 102 may be, for example, silicon dioxide or some other oxide. The first semiconductor substrate 104 may be, for example, a bulk silicon substrate of elemental or pure silicon. In some embodiments, the first oxide layer 102 is formed by thermal oxidation or vapor deposition, such as, for example, chemical vapor deposition (CVD) or physical vapor deposition (PVD).

Figure 2:
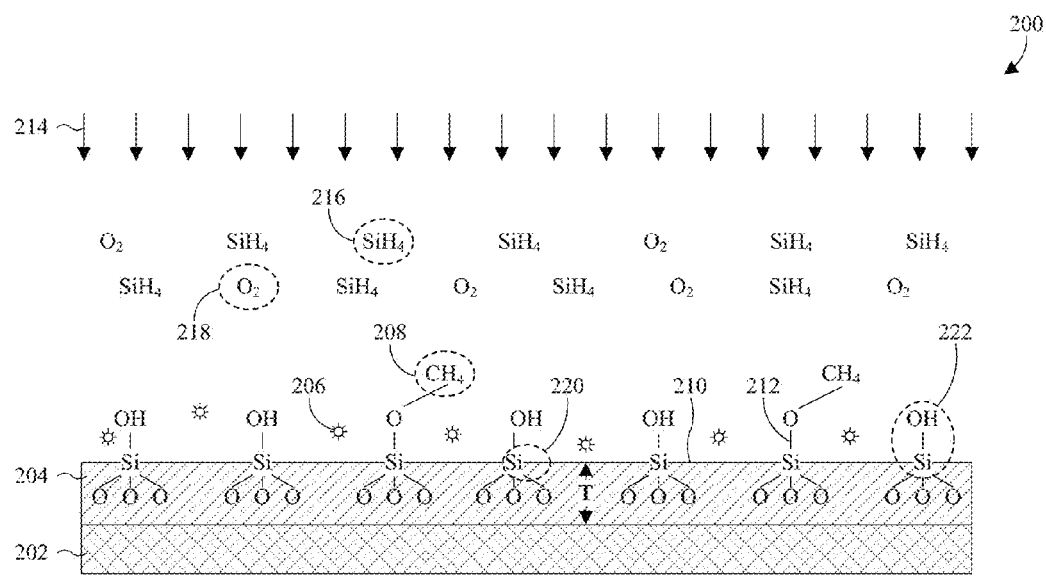

As illustrated by the cross-sectional view 200 of FIG. 2, a second semiconductor substrate 202 supporting a second oxide layer 204 is provided. The second semiconductor substrate 202 may be, for example, a bulk silicon substrate of elemental or pure silicon. The second oxide layer 204 is a native oxide layer that grew spontaneously on the second semiconductor substrate 202 by thermal oxidation. For example, the second oxide layer 204 may have grown while the second semiconductor substrate 202 was exposed to an uncontrolled environment. In some embodiments, the second oxide layer 204 is silicon dioxide or some other oxide, and/or has a thickness T less than or equal to about 5 nanometers, such as less than or equal to about 2 nanometers.

Contaminants 206, 208 are arranged on a surface 210 of the second oxide layer 204 that is on an opposite side of the second oxide layer 204 as the second semiconductor substrate 202. The contaminants 206, 208 inhibit fusion bonding by, for example, occupying silicon bond sites 212 on the surface 210 of the second oxide layer 204 that could otherwise be occupied by silanol groups and/or by spacing surfaces 210 to be fusion bonded together. The contaminants 206, 208 may be, for example, particle contaminants 206, such as dust particles, organic contaminants 208, ionic contaminants, or any combination of the foregoing. The organic contaminants 208 may, for example, be bonded to the surface 210 of the second oxide layer 204 through organic bonds, such as carbon-oxygen (C—O) bonds or carbon-hydrogen (C—H) bonds. Further, the organic contaminants 208 may be, for example, hydrocarbons, such as methane ($CH_4$).

Also illustrated by the cross-sectional view 200 of FIG. 2, the surface 210 of the second oxide layer 204 is preconditioned to enhance a hydrophilicity of the surface 210. The surface 210 of the second oxide layer 204 is preconditioned by exposure of the surface 210 to a preconditioning agent 214 comprising monosilane 216 ($SiH_4$) while heat is applied to the surface 210. In some embodiments, the preconditioning agent 214 further comprises oxide ($O_2$) 218 mixed with the monosilane ($SiH_4$) 216, and/or the surface 210 of the second oxide layer 204 is exposed to the preconditioning agent 214 at a temperature of about 400-450 degrees Celsius. For example, the surface 210 of the second oxide layer 204 may be exposed to the preconditioning agent 214 at a temperature of about 420 degrees Celsius. Even more, in some embodiments, the preconditioning agent 214 is a gas. During exposure of the surface 210 of the second oxide layer 204 to the preconditioning agent 214, the monosilane ($SiH_4$) 216 decomposes into silicon and hydrogen according to the following reaction: $SiH_4 \rightarrow Si+2H_2$. The hydrogen then reacts with silicon 220 on the surface 210 of the second oxide layer 204 to form silanol groups 222 on the surface 210. In some embodiments, a gas flow rate of the preconditioning agent 214 is varied to control the reaction and hence the extent of the preconditioning.

Advantageously, the surface 210 of the second oxide layer 204 has a high density of silanol groups 222 (i.e., high hydrophilicity) due to preconditioning the surface 210. This, in turn, results in a strong fusion bond and a low likelihood of peeling (i.e., bond failure). Further, the density of silanol groups 222 on the surface 210 of the second oxide layer 204 is substantially uniform between workpieces during bulk manufacture due to preconditioning the surface 210. This, in turn, results in good W2W uniformity and yield.

While the preconditioning agent 214 was applied to the surface MO of the second oxide layer 204, the preconditioning agent 214 may additionally or alternatively be applied to the surface 106 of the first oxide layer 102 in FIG. 1. Further, while the preconditioning agent 214 was described as comprising monosilane 216, the preconditioning agent 214 may comprise some other silane in place of monosilane 216. The other silane may have, for example, one or more atoms of silicon with each silicon atom having four bonds, and each of the four bonds bonding to a hydrogen atom or another silicon atom. Further, the other silane may be, for example, a linear silane, a branched silane, or a cyclic silane. The linear silane has a form of $Si_nH_{2n+2}$, where n is greater than or equal to one. For example, the linear silane may be disilane ($Si_2H_6$) or trisilane ($Si_3H_8$). The branched silane may be, for example, n-pentasilane, isopentasilane, and neopentasilane, where n is greater than or equal to one. Even more, the other silane may be, for example, a hydrosilane or an organosilane. The hydrosilane may be, for example, chlorosilane, iodosilane, or tribromosilane. The organosilane may be, for example, methylsilane, 3-(Trimethylsilyl)propanoic acid, or trimethyl (trifluoromethyl)silane. Even more, while the preconditioning agent 214 was described as comprising a silane, the preconditioning agent 214 may comprise, for example, a silene, a heterosilane, an organoheterosilane, a silanol, a silanone, or a fluorosilane in place of the silane.

Figure 3:
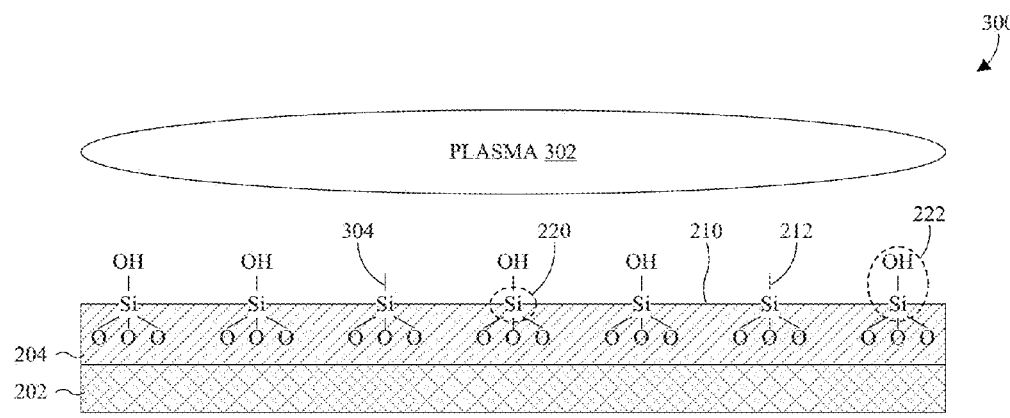

As illustrated by the cross-sectional view 300 of FIG. 3, the surface 210 of the second oxide layer 204 is activated by plasma treatment in which the surface 210 of the second oxide layer 204 is exposed to plasma 302. In some embodiments, the plasma treatment is performed by a dielectric barrier discharge (DBD) process, a reactive ion etching (RIE) process, a remote plasma, or a sequential plasma (SPAB) process. Further, in some embodiments, the plasma 302 is an argon plasma, an oxygen plasma, or a nitrogen plasma, and/or the plasma is formed from a process gas mixture comprising argon gas, hydrogen gas, oxygen gas, nitrogen gas, or any combination of the foregoing gases. The plasma treatment removes the contaminants 206, 208 (see FIG. 2) from the surface 210 of the second oxide layer 204, which may increase the number of vacant silicon bond sites 212, 304 on the surface 210 of the second oxide layer 204. For example, by removing the contaminants 206, 208, silicon bonds sites 212, 304 that were previously occupied by contaminants 208 are freed, such that additional silanol groups may form at the silicon bond sites 212, 304.

While the surface activation was described as being performed by plasma treatment, the surface activation may be performed by CMP, chemical cleaning, plasma treatment, some other approach to surface activation, or any combination of the foregoing. Further, while the surface activation was limited to the surface 210 of the second oxide layer 204, the surface 106 of the first oxide layer 102 (see FIG. 1) may additionally or alternative be activated. Such activation may be performed as described above with regard to plasma treatment and/or using one or more other approaches to surface activation.

In some embodiments, a cleaning procedure is performed on the surface(s) 106, 210 of the first and/or second oxide layers 102, 204 between preconditioning the surface(s) 106, 210 and activating the surface(s) 106, 210. The cleaning procedure may be, for example, an RCA cleaning procedure comprising the sequential application of a first cleaning solution and/or a second cleaning solution. The first cleaning solution may comprise, for example, ammonium hydroxide, hydrogen peroxide, deionized water, or any combination of the foregoing. The second cleaning solution may comprise, for example, hydrogen chloride, hydrogen peroxide, deionized water, or any combination of the foregoing. Further, in some embodiments, the surface(s) 106, 210 of the first and/or second oxide layers 102, 204 may be rinsed after activating the surface(s) 106, 210. For example, the surface(s) 106, 210 of the first and/or second oxide layers 102, 204 may be rinsed with deionized water.

Figure 4:
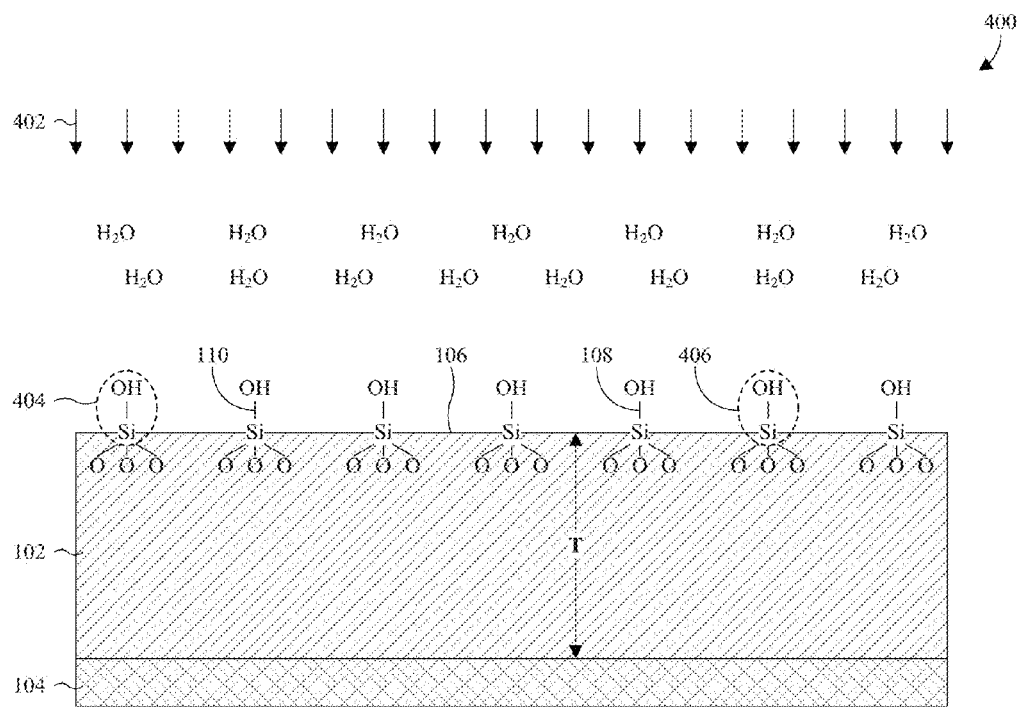

As illustrated by the cross-sectional view 400 of FIG. 4, water 402 (i.e., $H_2O$) is applied to the surface 106 of the first oxide layer 102. The water 402 reacts with vacant silicon bond sites 108, 110 (see FIG. 1) on the surface 106 of the first oxide layer 102 to terminate the vacant silicon bond sites 108, 110 and form silanol groups 404, 406 on the surface 106. In some embodiments, the water 402 is deionized water.

Figure 5:
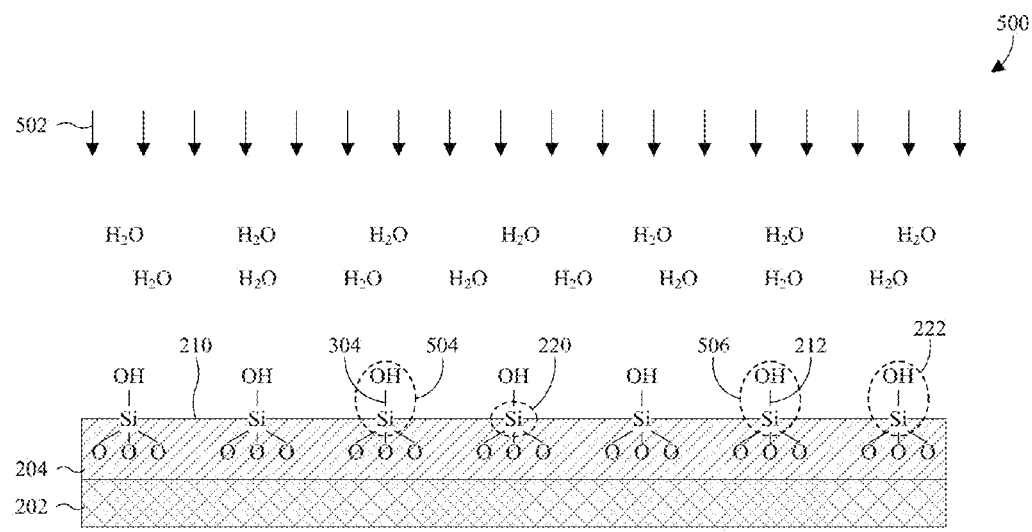

As illustrated by the cross-sectional view 500 of FIG. 5, water 502 (i.e., $H_2O$) is applied to the surface 210 of the second oxide layer 204. The water 502 reacts with vacant silicon bond sites 212, 304 (see, FIG. 3) on the surface 210 of the second oxide layer 204 to terminate the vacant silicon bond sites 212, 304 and form additional silanol groups 504, 506 on the surface 210. In some embodiments, the water 502 is deionized water.

While FIGS. 4 and 5 describe the application of water 402, 502 to both of the surfaces 106, 210 of the first and second oxide layers 102, 204, the water 402, 502 may alternatively be applied to one of the surfaces 106, 210 but not the other surface 106, 210. For example, water may be applied to the surface 106 of the first oxide layer 102, but not to the surface 210 of the second oxide layer 204.

Figure 6:
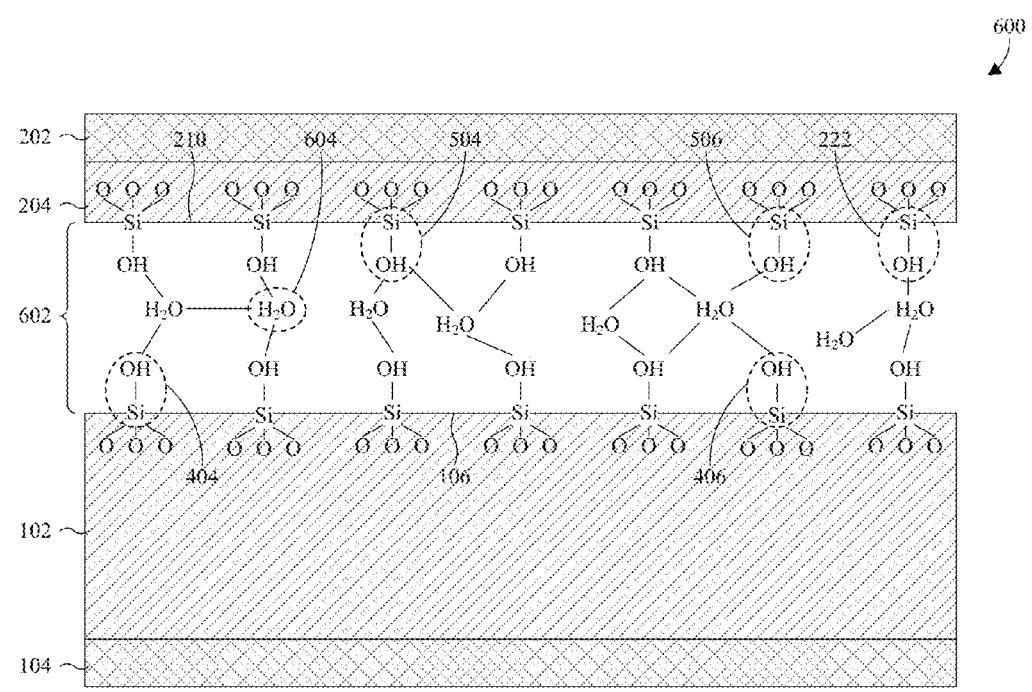

As illustrated by the cross-sectional view 600 of FIG. 6, the surfaces 106, 210 of the first and second oxide layers 102, 204 are placed in direct contact, thereby forming a weak bond 602 between the surfaces 106, 210 of the first and second oxide layers 102, 204. Silanol groups 222, 504, 506 on the surface 210 of the second oxide layer 204 bond to silanol groups 404, 406 on the surface 106 of the first oxide layer 102 through intermediate water molecules 604, such that the water molecules 604 form a bridge between the surfaces 106, 210. Further, in some embodiments, the silanol groups 222, 404, 406, 504, 506 of the first and second oxide layers 102, 204 begin to bond by van der Waals forces. For ease of illustration, bonding by van der Waals forces is not shown in FIG. 6, since it is more prominent during the annealing described hereafter.

Figure 7:
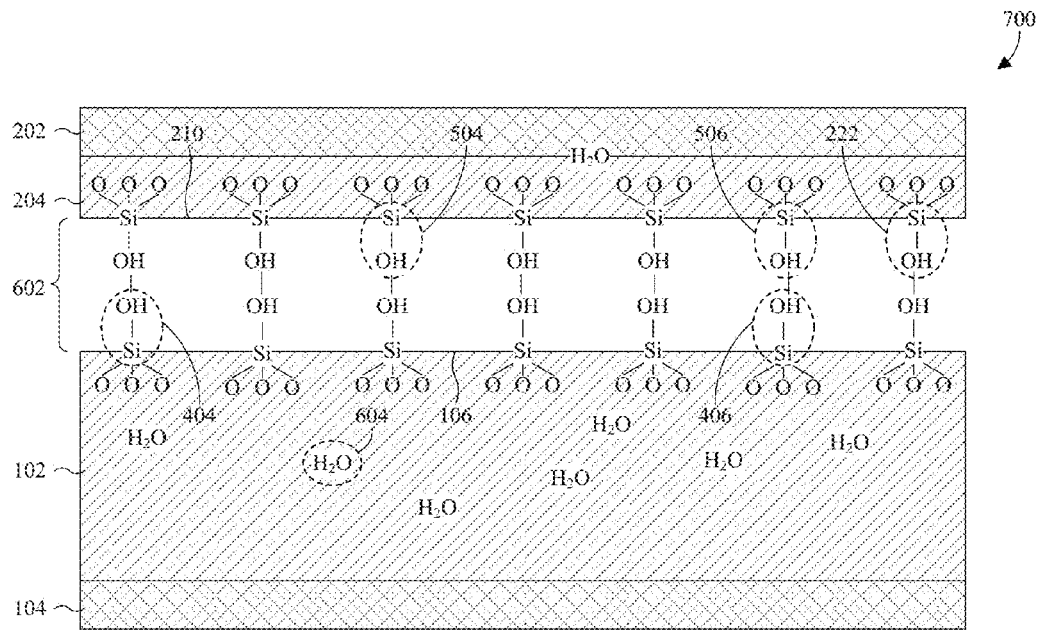

As illustrated by the cross-sectional view 700 of FIG. 7, the first and second oxide layers 102, 204 are annealed to strengthen the bond 602 between the surfaces 106, 210 of the first and second oxide layers 102, 204. In some embodiments, the annealing is performed at about 100-500 degrees Celsius, and/or in a gaseous atmosphere or a vacuum. For example, the annealing may be performed at about 400 degrees Celsius. During annealing, the water molecules 604 between the surfaces 106, 210 of the first and second oxide layers 102, 204 (see FIG. 6) diffuse into the first and second oxide layers 102, 204. This, in turn, allows the silanol groups 222, 404, 406, 504, 506 on the surfaces 106, 210 of the first and second oxide layers 102, 204 to bond by van der Waals forces. Further, in some embodiments, the water molecules 604 react with silicon on the surfaces 106, 210 of the first and second oxide layers 102, 204 to form additional silanol groups on the surfaces 106, 210.

Figure 8:
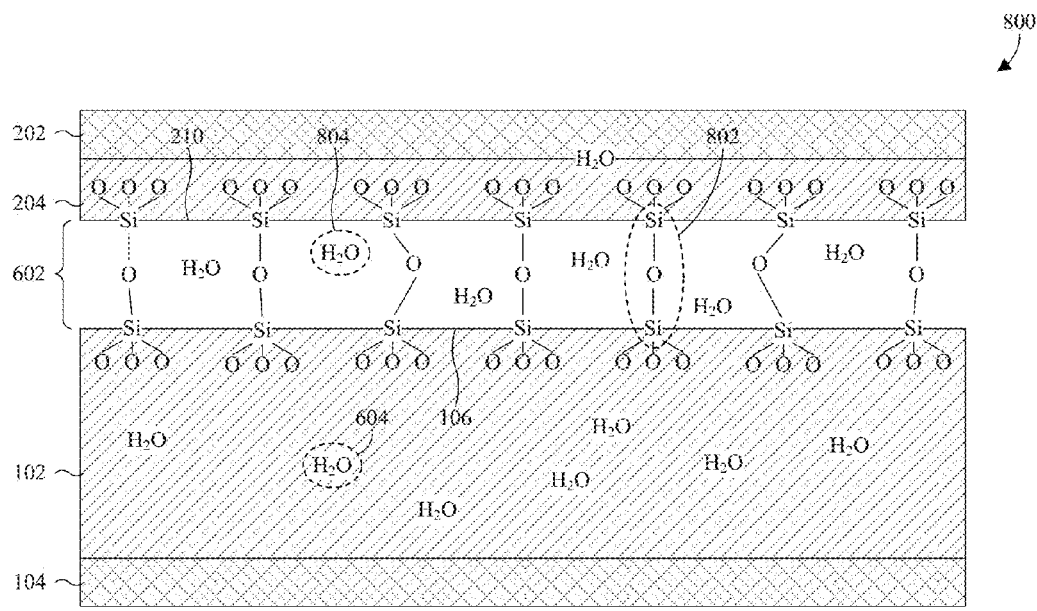

As illustrated by the cross-sectional view 800 of FIG. 8, annealing of the first and second oxide layers 102, 204 continues. With the continued annealing, the silanol groups 222, 404, 406, 504, 506 (see FIG. 7) on the surfaces 106, 210 of the first and second oxide layers 102, 204 polymerize to form siloxane molecules 802 and water molecules 804 between the surfaces 106, 210. The silanol groups 222, 404, 406, 504, 506 may, for example, polymerize according to the following equation: Si—OH+OH—Si→Si—O—Si+$H_2O$. Further, the resulting water molecule 804 between the surfaces 106, 210 of the first and second oxide layers 102, 204 diffuse from the bond 602 into the first and second oxide layers 102, 204.

Figure 9:
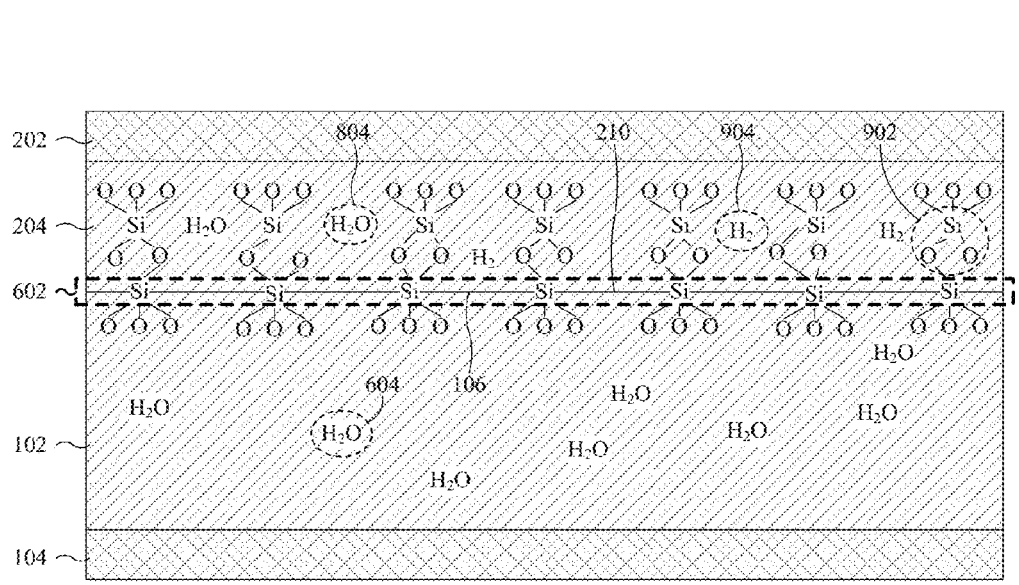

As illustrated by the cross-sectional view 900 of FIG. 9, water molecules 604, 804 diffusing through the first and second oxide layers 102, 204 reach the second semiconductor substrate 202. When the water molecules 604, 804 reach the second semiconductor substrate 202, the water molecules 604, 804 react with the second semiconductor substrate 202 to form silicon dioxide molecules 902 and hydrogen gas molecules 904 according to the following equation: $Si+2H_2O \rightarrow SiO_2+2H_2$. The resulting silicon dioxide molecules 902 expand the second oxide layer 204 and further strengthen the bond 602. For example, a thickness of the second oxide layer 204 may increase. The resulting hydrogen gas molecules 904 do not react with the first and second oxide layers 102, 204 and the first and second semiconductor substrates 104, 202, and dissolve in the first and second oxide layers 102, 204.

While the water molecules 604, 804 were described as diffusing to the second semiconductor substrate 202, the water molecules 604, 804 may additionally or alternatively diffuse to the first semiconductor substrate 104. However, due to the increased thickness of the first oxide layer 102 relative to the second oxide layer 204, the likelihood of the water molecules 604, 804 reaching the first semiconductor substrate 104 is less than that of reaching the second semiconductor substrate 202.

Figure 10:
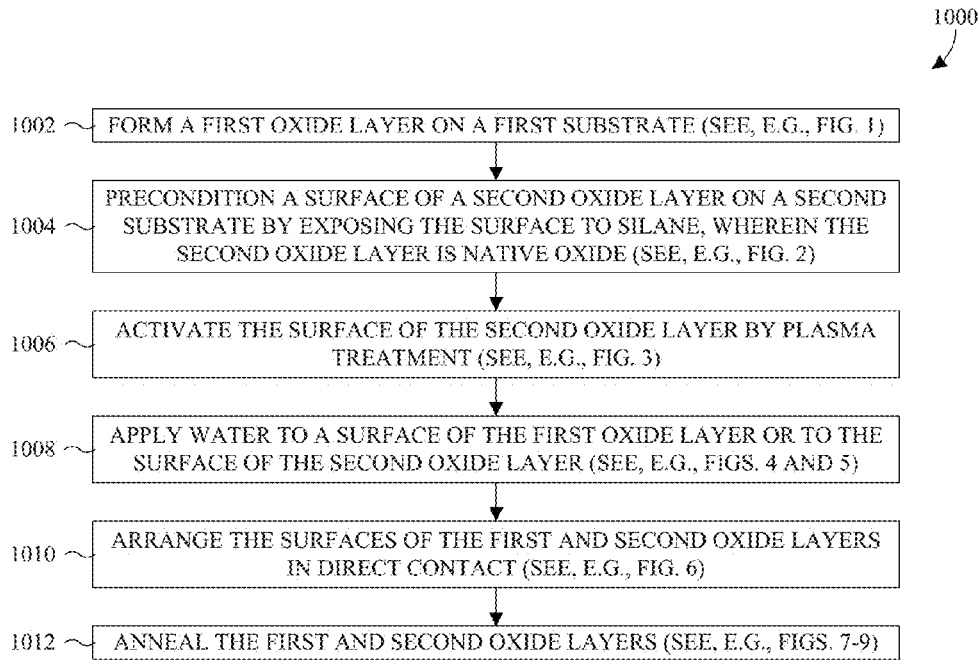
FIG. 10 illustrates a flowchart of some embodiments of the method of FIGS. 1-9.

With reference to FIG. 10, a flowchart 1000 of some embodiments of the method of FIGS. 1-9 is provided.

At 1002, a first oxide layer is formed on a first substrate. See, for example, FIG. 1.

At 1004, a surface of a second oxide layer on a second substrate is preconditioned by exposing the surface to silane. The second oxide layer is native oxide. See, for example, FIG. 2. Advantageously, the surface of the second oxide layer has a high density of silanol groups (i.e., a high hydrophilicity) due to preconditioning the surface. This, in turn, results in a strong fusion bond and a low likelihood of peeling. Further, the density of silanol groups on second oxide layer surface is substantially uniform between workpieces during bulk manufacture due to preconditioning the surface, such that W2W uniformity and yield are high.

At 1006, the surface of the second oxide layer is activated by plasma treatment. See, for example, FIG. 3. In alternative embodiments, the surface of the second oxide layer is activated by other approaches to surface activation.

At 1008, water is applied to a surface of the first oxide layer or to the surface of the second oxide layer. See, for example, FIGS. 4 and 5.

At 1010, the surfaces of the first and second oxide layers are arranged in direct contact. See, for example, FIG. 6.

At 1012, the first and second oxide layers are annealed. See, for example, FIGS. 7-9.

While the method described by the flowchart 1000 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 11:
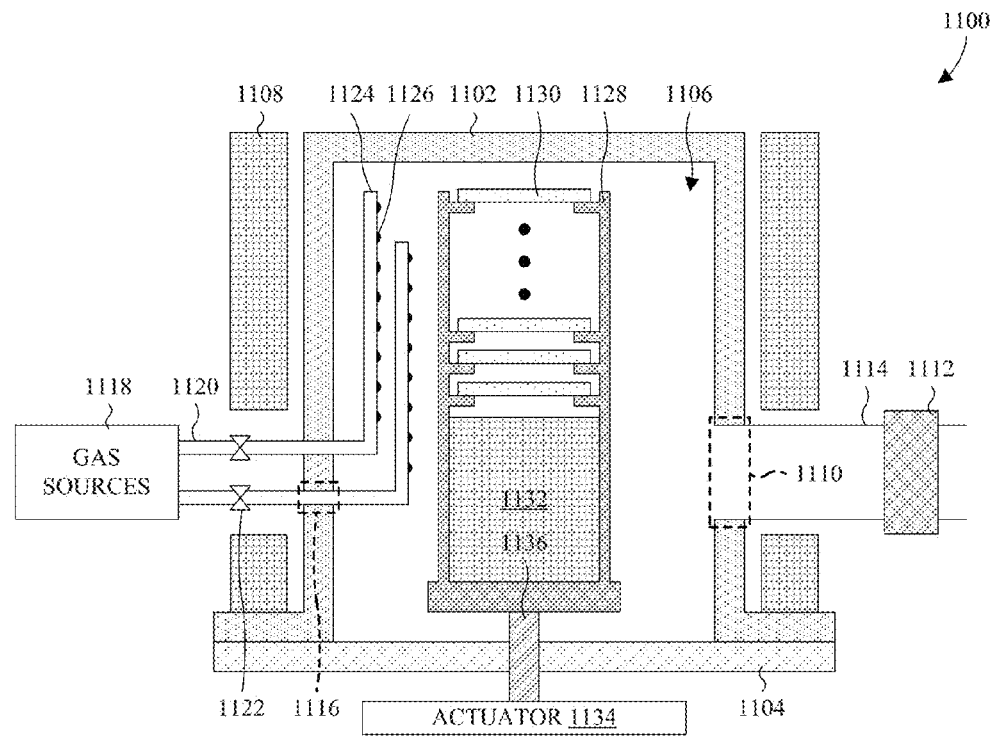
FIG. 11 illustrates a process tool for performing silane preconditioning in FIGS. 1-9.

With reference to FIG. 11, a cross-sectional view 1100 of some embodiments of a process tool for silane preconditioning is provided. The process tool may, for example, be used to perform Act 1004 of FIG. 10. As illustrated, upper and lower components 1102, 1104 of a housing define a reactor chamber 1106 that is laterally surrounded by a first heater 1108. An exhaust outlet 1110 is arranged in the housing and configured to provide gases from the reactor chamber 1106 to an exhaust pump 1112 through an exhaust outlet line 1114. Gas inlets 1116 are arranged in the housing and configured to provide gases from one or more gas sources 1118 through corresponding gas inlet lines 1120. In some embodiments, valves 1122 corresponding to the gas inlet lines 1120 are arranged along the gas inlet lines 1120 and configured to control the flow (e.g., flow rate) of the gases to the gas inlets 1116. Further, in some embodiments, the gas is silane (e.g., $SiH_4$) or a functional equivalent of silane.

Gas distribution lines 1124 and corresponding nozzles 1126 are arranged in the reactor chamber 1106, and extend from the gas inlets 1116. The gas distribution lines 1124 and the nozzles 1126 are configured to introduce the gases into the reactor chamber 1106. Further, a workpiece holder 1128 is arranged in the reactor chamber 1106, and is configured to support a plurality of workpieces 1130 at a plurality of different locations. The workpieces 1130 may, for example, comprise the second semiconductor substrate 202 of FIG. 2. The workpiece holder 1128 is further configured to support a second heater 1132 arranged under the workpieces 1130. The workpiece holder 1128 is arranged over and connected to an actuator 1134 by a shaft 1136. The actuator 1134 is configured to move the workpiece holder 1128 into and out of the reactor chamber 1106 while loading and unloading the reactor chamber 1106.

Figure 12:
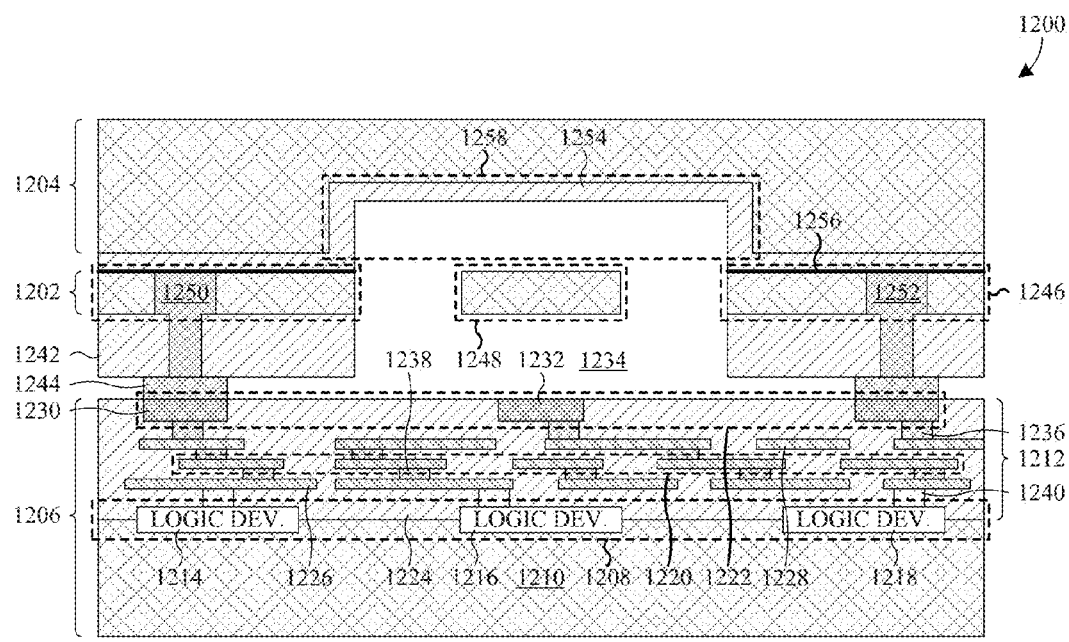
FIG. 12 illustrates a cross-sectional view of some embodiments of a microelectromechanical systems (MEMS) package with a pair of substrates fusion bonded according to the method of FIGS. 1-9.

With reference to FIG. 12, a cross-sectional view 1200 of some embodiments of a MEMS package with a pair of substrates 1202, 1204 fusion bonded according to the method of FIGS. 1-9 and/or FIG. 10 is provided. As illustrated, a support device 1206 comprises a device region 1208 arranged on an upper surface of a support substrate 1210, and an interconnect structure 1212 covering the device region 1208 and the support substrate 1210. The device region 1208 comprises electronic devices 1214, 1216, 1218, such as transistors, photodiodes, memory cells, etc. The support substrate 1210 may be, for example, a bulk semiconductor substrate, such as a bulk silicon substrate, or a silicon-on-insulator (SOI) substrate.

The interconnect structure 1212 interconnects the electronic devices 1214, 1216, 1218 in the device region 1208. A stack of conductive layers 1220, 1222 are arranged within a dielectric region 1224 comprising multiple inter-layer dielectric (ILD) layers and a passivation layer (not individually shown). The conductive layers 1220, 1222 comprise individual features 1226, 1228, such as lines and pads, and a topmost conductive layer 1222 comprises a support bond ring 1230 and a fixed sensing electrode 1232. The support bond ring 1230 extends laterally to enclose a cavity 1234 overlying the support device 1206, and the fixed sensing electrode 1232 is arranged under the cavity 1234. Vias 1236, 1238 are arranged in the dielectric region 1224, between the conductive layers 1220, 1222, to interconnect the conductive layers 1220, 1222. Similarly, contacts 1240 are arranged in the dielectric region 1224, between a bottommost conductive layer (not labeled) and the device region 1208, to connect the device region 1208 to the bottommost conductive layer. The conductive layers 1220, 1222, the vias 1236, 1238, and the contacts 1240 may be, for example, a metal, such as copper, aluminum copper, or tungsten, or some other conductive material. The dielectric region 1224 may be or otherwise include, for example, an oxide, a low κ dielectric (i.e., a dielectric with a dielectric constant less than about 3.9), or some other dielectric material.

A support ISD layer 1242 and a device bond ring 1244 are stacked over the support device 1206, between the support device 1206 and a MEMS device substrate 1202. The support ISD layer 1242 and the device bond ring 1244 laterally enclose the cavity 1234 and bond the MEMS device substrate 1202 to the support device 1206 at an interface between the support bond ring 1230 and the device bond ring 1244. The support ISD layer 1242 is arranged over the device bond ring 1244, between the device bond ring 1244 and the MEMS device substrate 1202. The support ISD layer 1242 may be, for example, a thermal oxide or some other dielectric material. The device bond ring 1244 underlies the support ISD layer 1242 and interfaces with the support bond ring 1230. In some embodiments, the device bond ring 1244 interfaces with the support bond ring 1230 at a eutectic bond. Further, the device bond ring 1244 overlaps with the support bond ring 1230 and has a ring-shaped footprint of similar or equal size (e.g., in terms of area) as that of the support bond ring 1230. The device bond ring 1244 may be, for example, germanium or some other conductive material.

The MEMS device substrate 1202 is arranged over and bonded to the support device 1206 through the support ISD layer 1242 and the device bond ring 1244. The MEMS device substrate 1202 comprises a fixed region 1246 and a movable element 1248 (i.e., a movable region), and may be, for example, a bulk semiconductor substrate of elemental or pure silicon. The fixed region 1246 corresponds to a region of the MEMS device substrate 1202 that is fixed relative to the movable element 1248. The movable element 1248 corresponds to a region of the MEMS device substrate 1202 that is suspended within the cavity 1234, over the fixed sensing electrode 1232, and is configured to move within the cavity 1234 in proportion to external stimuli, such as acceleration. The movable element 1248 is suspended by one or more cantilever beams or springs (not shown) that connect the movable element 1248 to the fixed region 1246. Further, the movable element 1248 comprises a movable sensing electrode (not shown) that is electrically coupled to the support device 1206 by through substrate vias (TSVs) 1250, 1252 extending through the MEMS device substrate 1202 and the support ISD layer 1242 to, for example, the device bond ring 1244. The TSVs 1250, 1252 may, for example, comprise a metal or some other conductive material.

A capping substrate 1204 is arranged over and bonded to the MEMS device substrate 1202 through a capping ISD layer 1254 lining a lower surface of the capping substrate 1204. In some embodiments, the capping ISD layer 1254 conformally lines the lower surface. The capping substrate is bonded to the MEMS device substrate 1202 by a fusion bond 1256 at an interface between the capping ISD layer 1254 and the MEMS device substrate 1202. The fusion bond 1256 may, for example, be formed according to the method of FIGS. 1-9 and/or of FIG. 10, such that the fusion bond 1256 has high strength and W2W uniformity. The capping substrate 1204 defines an upper surface of the cavity 1234 and, in some embodiments, comprises a lower recess 1258 defining an upper region of the cavity 1234. The capping substrate 1204 may be, for example, a bulk semiconductor substrate of elemental or pure silicon.

In operation, the movable element 1248 moves within the cavity 1234 in proportion to external stimuli, such as acceleration. For example, as the MEMS package is accelerated, the movable element 1248 moves within the cavity 1234 in proportion to the acceleration. Capacitive coupling between the fixed sensing electrode 1232 and the movable sensing electrode (not shown) is then used to measure the movement of the movable element 1248 and to indirectly measure the external stimuli.

While the position of the movable element 1248 is illustrated and described as being determined by capacitive coupling between sensing electrodes in FIG. 12, other approaches may be employed to sense the position of the movable element 1248 within the cavity 1234. For example, optical approaches may be employed to sense the position of the movable element 1248 with the cavity 1234. Further, while the movable element 1248 is illustrated and described as being suspended within the cavity 1234 between the support device 1206 and the capping substrate 1204, the movable element 1248 may be a flexible membrane covering the cavity 1234 in other embodiments. In such embodiments, the movable element 1248 defines an upper surface of the cavity 1234 and is configured to deflect in proportion to external stimuli, such as pressure. Further, the capping substrate 1204, the capping ISD layer 1254, and the support and device bond rings 1230, 1244 are omitted, and the MEMS device substrate 1202 is fusion bonded to the support device 1206 at an interface between the support device 1206 and the support ISD layer 1242. The fusion bond may, for example, be formed according to the method of FIGS. 1-9 and/or of FIG. 10, such that the fusion bond has high strength and W2W uniformity.

With reference to FIGS. 13-21, a series of cross-sectional views 1300-2100 of some embodiments of a method for forming the MEMS package of FIG. 12 is provided.

Figure 13:
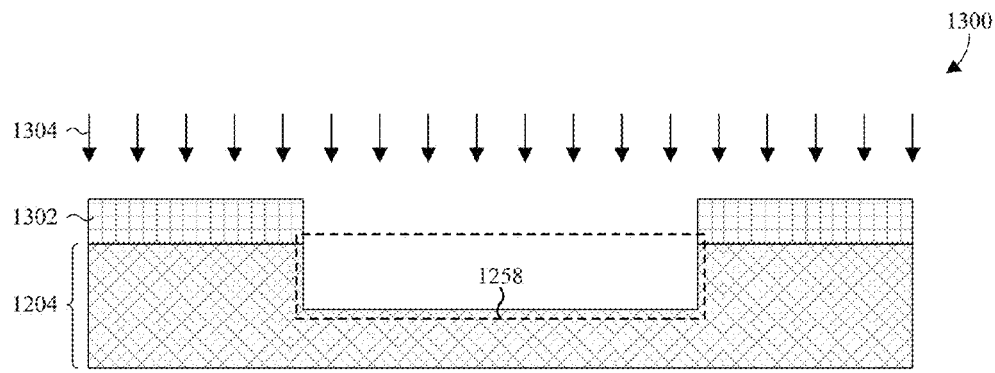
FIGS. 13-21 illustrate a series of cross-sectional views of some embodiments of a method for forming the MEMS package of FIG. 12.

As illustrated by the cross-sectional view 1300 of FIG. 13, a first etch is performed into a capping substrate 1204 to form a recess 1258 in a surface of the capping substrate 1204. The capping substrate 1204 may be, for example, a bulk silicon substrate of elemental or pure silicon. In some embodiments, the process for performing the first etch comprises depositing and patterning a first photoresist layer 1302 over the capping substrate 1204. For example, the first photoresist layer 1302 may be patterned to mask regions of the capping substrate 1204 that are along a periphery of the capping substrate 1204. Thereafter, one or more etchants 1304, such as wet or dry etchants, are applied to the capping substrate 1204 while using the first photoresist layer 1302 as a mask. After performing the first etch, the first photoresist layer 1302 is removed or otherwise stripped.

Figure 14:
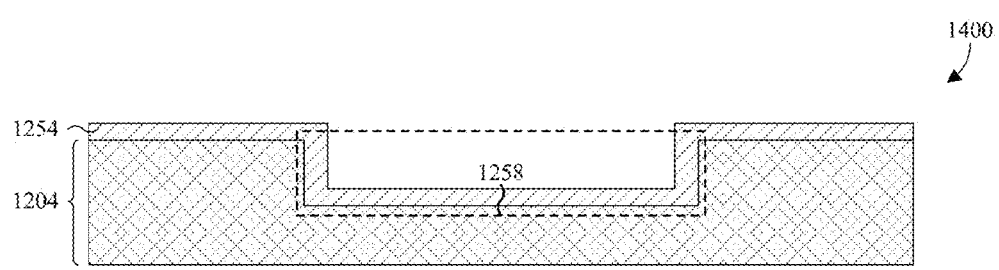

As illustrated by the cross-sectional view 1400 of FIG. 14, a capping ISD layer 1254 is formed lining the surface of the capping substrate 1204, including the recess 1258. In some embodiments, the capping ISD layer 1254 is silicon dioxide or some other oxide. Further, in some embodiments, the capping ISD layer 1254 is formed by thermal oxidation or vapor deposition, such as, for example, CVD or PVD.

Figure 15:
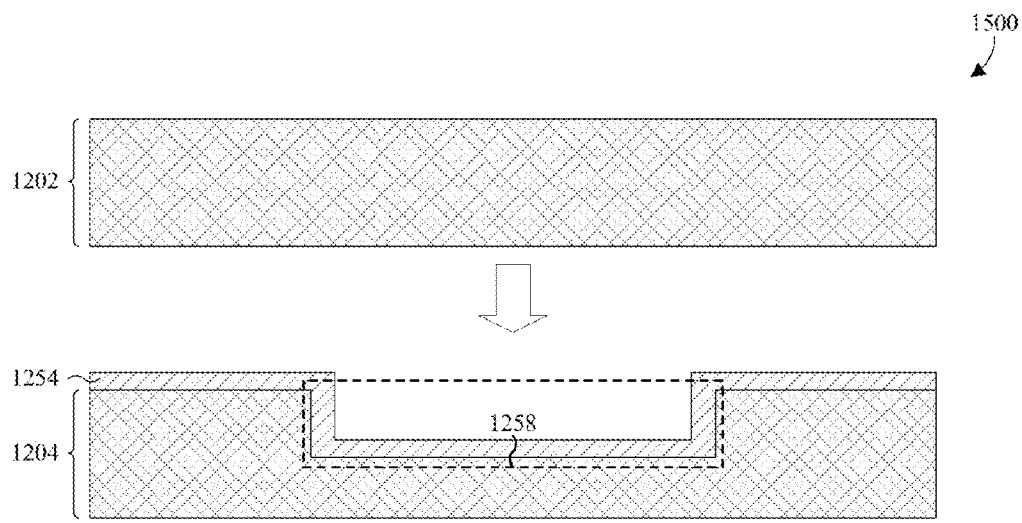

As illustrated by the cross-sectional view 1500 of FIG. 15, a MEMS device substrate 1202 is arranged over and bonded to the capping substrate 1204 through the capping ISD layer 1254. The MEMS device substrate 1202 is bonded to the capping substrate 1204 by fusion bonding performed with silane preconditioning according to the method of FIGS. 1-9 and/or 10. For example, the capping substrate 1204 may correspond to the first semiconductor substrate 104 in FIGS. 1-9, the capping ISD layer 1254 may correspond to the first oxide layer 102 in FIGS. 1-9, the MEMS device substrate 1202 may correspond to the second semiconductor substrate 202 in FIGS. 1-9, and a native oxide layer (not shown) on the MEMS device substrate 1202 may correspond to the second oxide layer 204. The MEMS device substrate 1202 may be, example, a bulk silicon substrate of elemental or pure silicon.

Figure 16:
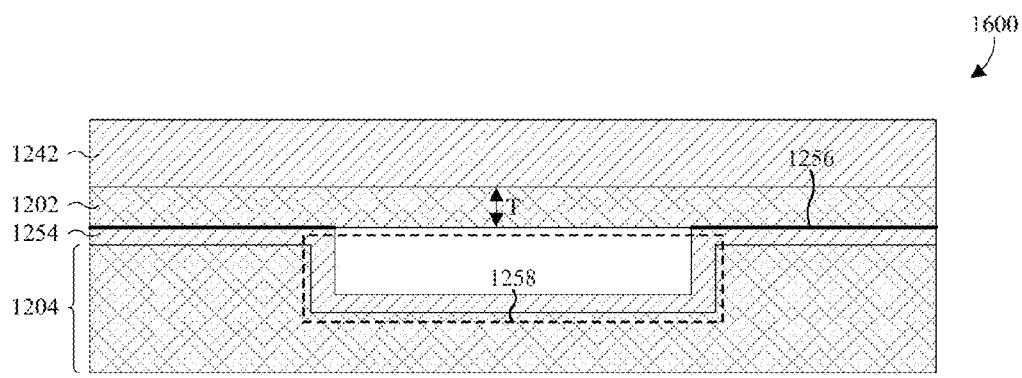

As illustrated by the cross-sectional view 1600 of FIG. 16, the MEMS device substrate 1202 is thinned to a desired thickness T after forming a fusion bond 1256 at an interface between the MEMS device substrate 1202 and the capping ISD layer 1254. In some embodiments, the MEMS device substrate 1202 is thinned by a CMP and/or an etch back. Further, a support ISD layer 1242 is formed over the MEMS device substrate 1202. In some embodiments, the support ISD layer 1242 is silicon dioxide or some other oxide. Further, in some embodiments, the support ISD layer 1242 is formed by thermal oxidation.

Figure 17:
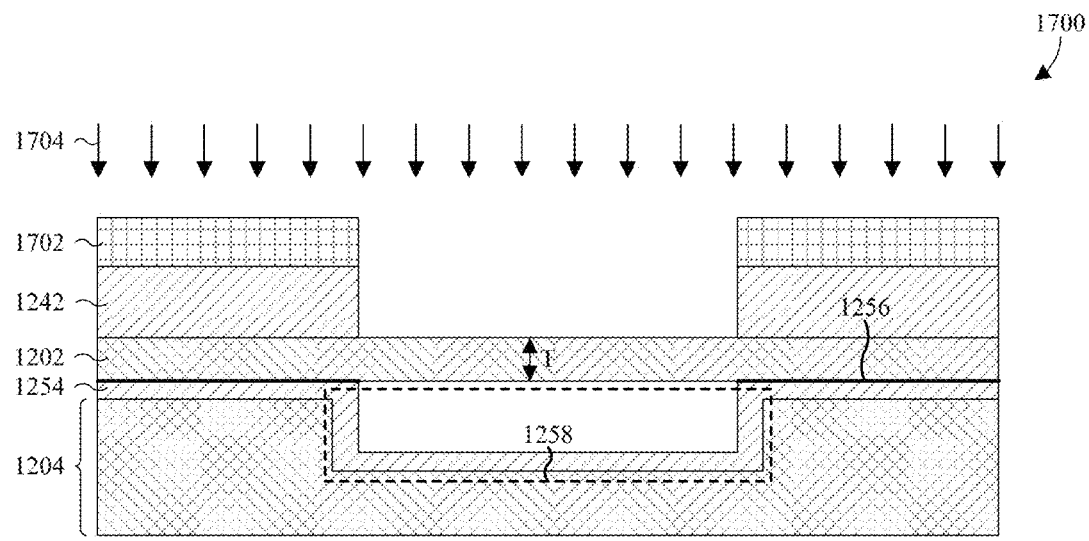

As illustrated by the cross-sectional view 1700 of FIG. 17, a second etch is performed into the support ISD layer 1242 to remove a region of the support ISD layer 1242 that overlies the recess 1258 of the capping substrate 1204 (i.e., to form an opening). In some embodiments, the region is restricted to directly over the recess 1258. Further, in some embodiments, the process for performing the second etch comprises depositing and patterning a second photoresist layer 1702 over the support ISD layer 1242. For example, the second photoresist layer 1702 may be patterned to mask regions of the support ISD layer 1242 that laterally surround the recess 1258. Thereafter, one or more etchants 1704 are applied to the support ISD layer 1242 while using the second photoresist layer 1702 as a mask. After performing the second etch, the second photoresist layer 1702 is removed or otherwise stripped.

Figure 18:
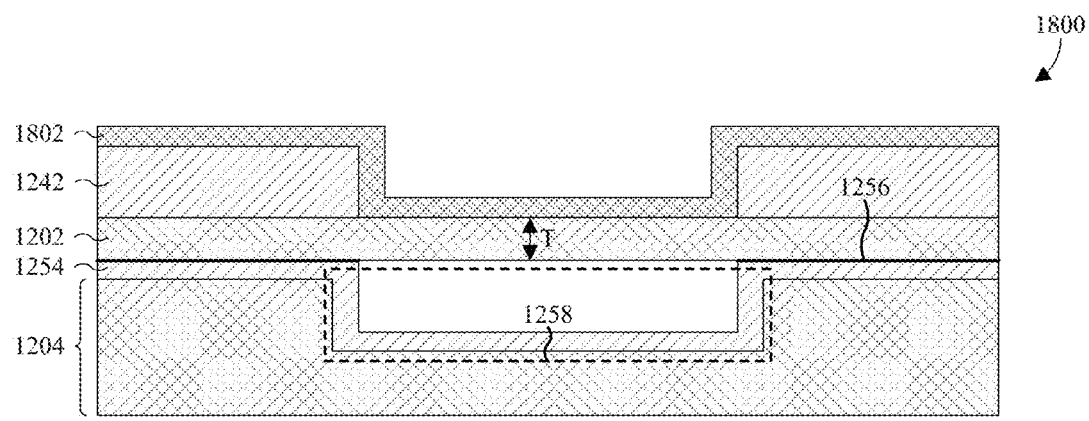

As illustrated by the cross-sectional view 1800 of FIG. 18, a bond ring layer 1802 is formed over the support ISD layer 1242 and the MEMS device substrate 1202. The bond ring layer 1802 may be formed of, for example, germanium or some other material capable of eutectic bonding. In some embodiments, the bond ring layer 1802 is formed using a vapor deposition technique or atomic layer deposition.

Figure 19:
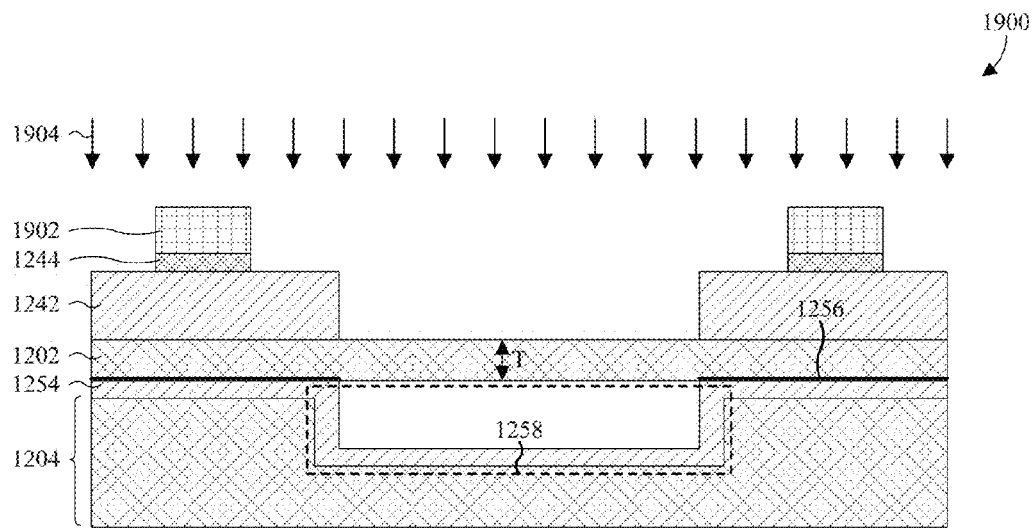

As illustrated by the cross-sectional view 1900 of FIG. 19, a third etch is performed into the bond ring layer 1802 (see FIG. 18) to form a device bond ring 1244 laterally enclosing the recess 1258. In some embodiments, the process for performing the third etch comprises depositing and patterning a third photoresist layer 1902 over the bond ring layer 1802. For example, the third photoresist layer 1902 may be patterned to mask regions of the bond ring layer 1802 that correspond to the device bond ring 1244. Thereafter, one or more etchants 1904 are applied to the bond ring layer 1802 while using the third photoresist layer 1902 as a mask. After performing the third etch, the third photoresist layer 1902 is removed or otherwise stripped.

Figure 20:
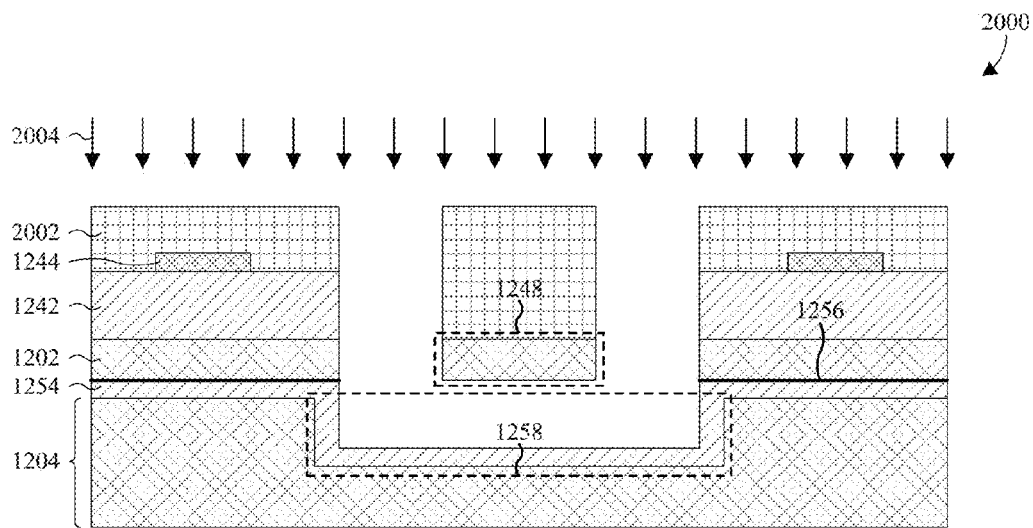

As illustrated by the cross-sectional view 2000 of FIG. 20, a fourth etch is performed into the MEMS device substrate 1202 to form a movable element 1248 over the recess 1258. In some embodiments, the process for performing the fourth etch comprises depositing and patterning a fourth photoresist layer 2002 over the support ISD layer 1242 and the MEMS device substrate 1202. For example, the fourth photoresist layer 2002 may be patterned to mask regions of the MEMS device substrate 1202 that correspond to the movable element 1248 and regions of the MEMS device substrate 1202 and the support ISD layer 1242 laterally surrounding the recess 1258. Thereafter, one or more etchants 2004 are applied to the MEMS device substrate 1202 while using the fourth photoresist layer 2002 as a mask. After performing the fourth etch, the fourth photoresist layer 2002 is removed or otherwise stripped.

Figure 21:
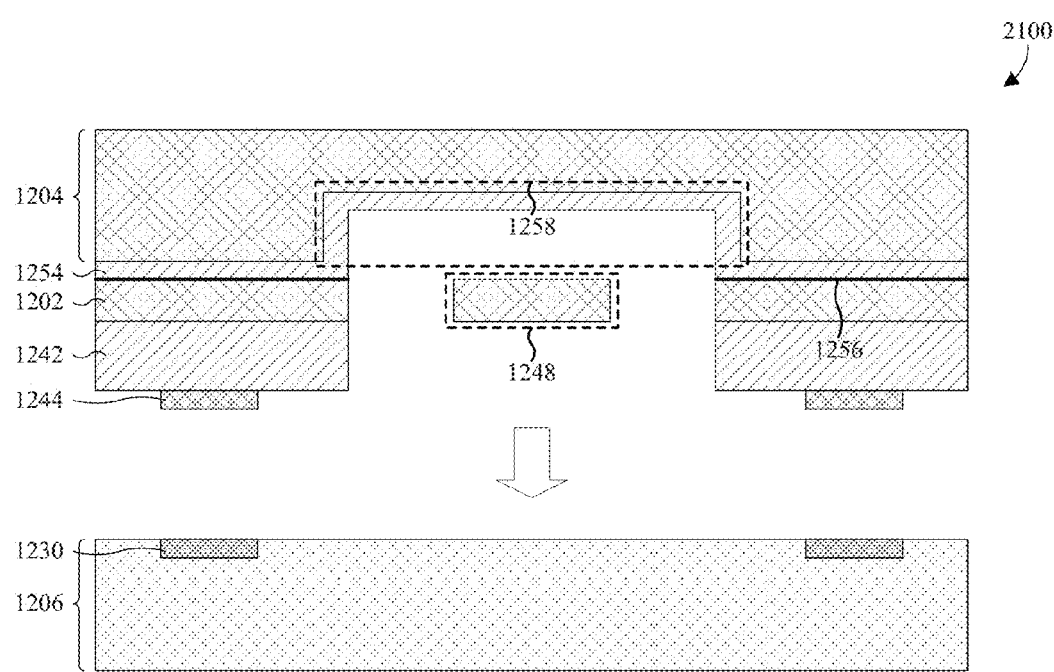

As illustrated by the cross-sectional view 2100 of FIG. 21, the MEMS device substrate 1202 and the capping substrate 1204 are rotated 180 degrees and bonded to a support device 1206. The support device 1206 may be, for example, an IC or a bulk semiconductor substrate. In some embodiments, the MEMS device substrate 1202 is eutectically bonded to the support device 1206 through a support bond ring 1230 of the support device 1206. The support bond ring 1230 has the same or a similar footprint as the device bond ring 1244, and may be, for example, aluminum copper or some other material capable of eutectic bonding.

Figure 22:
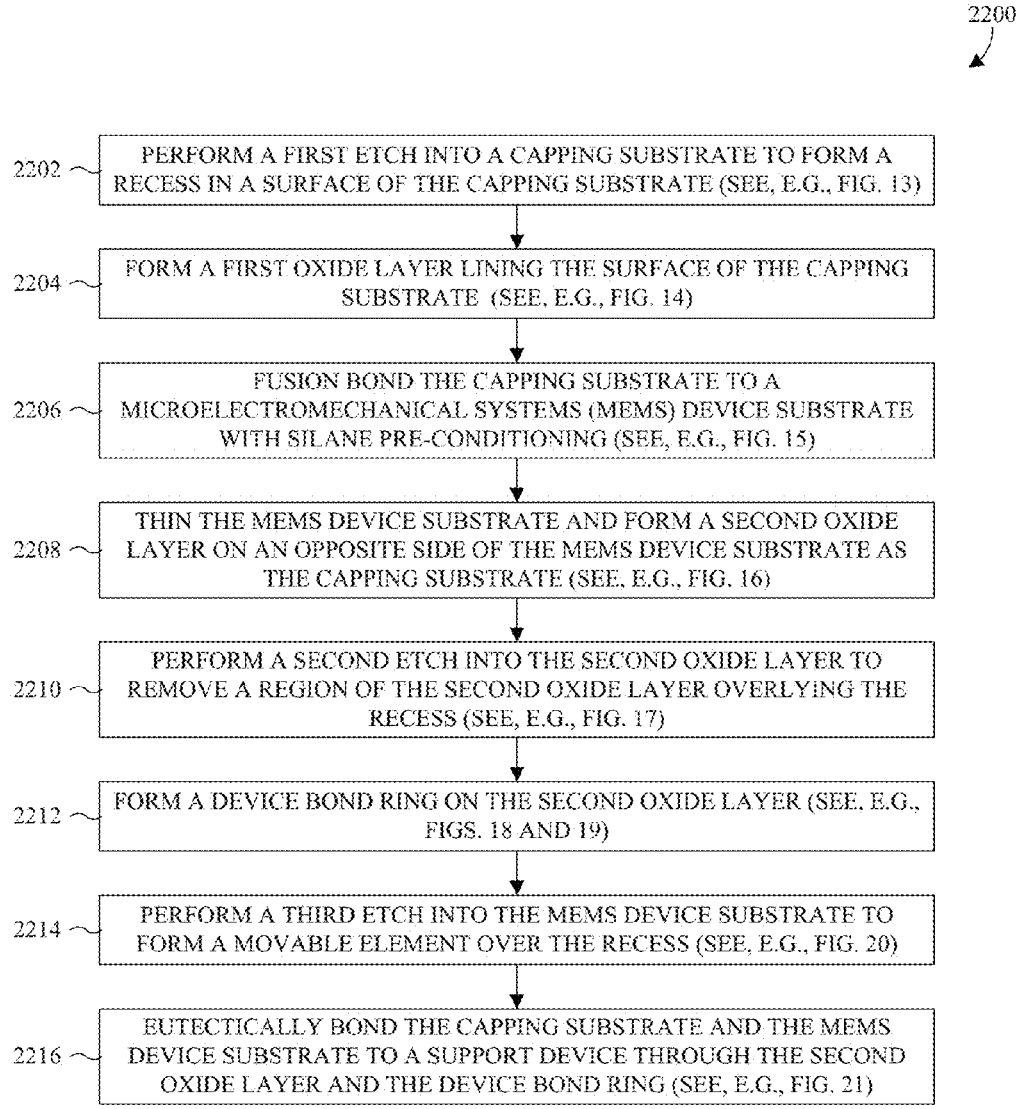
FIG. 22 illustrates a flowchart of some embodiments of the method of FIGS. 13-21.

With reference to FIG. 22, a flowchart 2200 of some embodiments of the method of FIGS. 13-21 is provided.

At 2202, a first etch is performed into a capping substrate to form a recess in a surface of the capping substrate. See, for example, FIG. 13.

At 2204, a first oxide layer is formed lining the surface of the capping substrate. See, for example, FIG. 14.

At 2206, the capping substrate is fusion bonded to a MEMS device substrate with silane preconditioning. See, for example, FIG. 15. The fusion bonding and/or the silane preconditioning may, for example, be performed as described in the method of FIGS. 1-10.

At 2208, the MEMS device substrate is thinned and a second oxide layer is formed on an opposite side of the MEMS device substrate as the capping substrate. See, for example, FIG. 16.

At 2210, a second etch is performed into the second oxide layer to remove a region of the second oxide layer overlying the recess. See, for example, FIG. 17.

At 2212, a device bond ring is formed on the second oxide layer. See, for example, FIGS. 18 and 19.

At 2214, a third etch is performed into the MEMS device substrate to form a movable element over the recess. See, for example, FIG. 20.

At 2216, the capping substrate and the MEMS device substrate are eutectically bonded to a support device through the second oxide layer and the device bond ring. See, for example, FIG. 21.

While the method described by the flowchart 2200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the Acts of FIG. 22 are augmented to form a pressure sensor. An oxide layer is formed on a MEMS device substrate, as described by Act 2208, and etched as described by Act 2210. The MEMS device substrate is then fusion bonded to a support device through the oxide layer, as described in Act 2206. The fusion bonding may be performed, for example, with silane pre-conditioning according to the method of FIGS. 1-10. Further, the MEMS device substrate is thinned as described in Act 2208.

Thus, as can be appreciated from above, the present disclosure provides a method for bonding a pair of semiconductor substrates together. A surface of a first oxide layer or a surface of a second oxide layer is preconditioned with silane. The first and second oxide layers are respectively arranged on first and second semiconductor substrates. Water is applied to the surface of the first or second oxide layer. The surfaces of the first and second oxide layers are brought in direct contact. The first and second oxide layers are annealed.

In other embodiments, the present disclosure provides a method for forming a MEMS package. An oxide layer is formed on a capping substrate. A device substrate is preconditioned by exposing the device substrate to silane. The device substrate is fusion bonded to the capping substrate through the oxide layer after exposing the device substrate to the silane. A movable element is formed in the device substrate. The device substrate is bonded to a support device on an opposite side of the device substrate as the capping substrate.

In yet other embodiments, the present disclosure provides a method for bonding a pair of semiconductor substrates together. An oxide layer is formed on a first semiconductor substrate. A surface of a native oxide layer is preconditioned with silane. The native oxide layer is arranged on a second semiconductor substrate. A surface of the oxide layer and the surface of the native oxide layer are arranged in direct contact. The oxide layer and the native oxide layer are annealed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for bonding a pair of semiconductor substrates together, the method comprising:
preconditioning a surface of a first oxide layer or a surface of a second oxide layer with silane, wherein the first and second oxide layers are respectively arranged on first and second semiconductor substrates;
applying water to the surface of the first or second oxide layer;
bringing the surfaces of the first and second oxide layers in direct contact; and
annealing the first and second oxide layers.

2. The method according to claim 1, further comprising:
preconditioning the surfaces of the first and second oxide layers with silane prior to bringing the surfaces in direct contact.

3. The method according to claim 1, wherein the second oxide layer has a thickness less than about 5 nanometers, and wherein the method further comprises:
forming the first oxide layer on the second semiconductor substrate with a thickness exceeding about 50 nanometers.

4. The method according to claim 1, wherein the second oxide layer is a native oxide.

5. The method according to claim 1, wherein preconditioning the surface of the first or second oxide layer comprises applying monosilane (SiH4) to the surface of the first or second oxide layer.

6. The method according to claim 1, wherein preconditioning the surface of the first or second oxide layer comprises applying heat to the first or second oxide layer.

7. The method according to claim 1, further comprising:
activating the surface of the first or second oxide layer by a plasma treatment that applies a plasma to the surface of the first or second oxide layer.

8. The method according to claim 7, further comprising:
cleaning the surface of the first or second oxide layer before activating the surface of the first or second oxide layer; and
rinsing the surface of the first or second oxide layer after activating the surface of the first or second oxide layer.

9. The method according to claim 7, further comprising:
activating the surfaces of the first and second oxide layers by the plasma treatment.

10. A method for forming a microelectromechanical systems (MEMS) package, the method comprising:
forming an oxide layer on a capping substrate;
preconditioning a surface of the oxide layer by exposing the surface of the oxide layer to silane;
fusion bonding a device substrate to the capping substrate through the oxide layer after exposing the oxide layer to the silane, wherein the fusion bonding is performed at the surface of the oxide layer;
forming a movable element in the device substrate; and
bonding the device substrate to a support device on an opposite side of the device substrate as the capping substrate.

11. The method according to claim 10, wherein fusion bonding the device substrate to the capping substrate comprises:
preconditioning a surface of a second oxide layer with the silane, the second oxide layer arranged on the device substrate; and
arranging the surfaces of the oxide layer and the second oxide layer in direct contact.

12. The method according to claim 11, wherein fusion bonding the device substrate to the capping substrate comprises:
applying water to the surface of the oxide layer or the surface of the second oxide layer; and
annealing the oxide layer and the second oxide layer.

13. The method according to claim 11, wherein the second oxide layer has a thickness less than about 5 nanometers, and wherein the method further comprises:
forming the oxide layer with a thickness exceeding about 50 nanometers.

14. The method according to claim 11, wherein the second oxide layer is a native oxide.

15. The method according to claim 11, wherein preconditioning the surface of the oxide layer or the surface of the second oxide layer comprises:
applying monosilane (SiH4) to the surface of the oxide layer or the surface of the second oxide layer.

16. The method according to claim 11, wherein preconditioning the surface of the oxide layer or the surface of the second oxide layer comprises:
applying heat to the oxide layer or the second oxide layer.

17. The method according to claim 11, further comprising:
activating the surface of the oxide layer or the surface of the second oxide layer by plasma treatment.

18. A method for bonding a pair of semiconductor substrates together, the method comprising:
forming an oxide layer on a first semiconductor substrate;
preconditioning a surface of a native oxide layer with silane, the native oxide layer arranged on a second semiconductor substrate;
arranging a surface of the oxide layer and the surface of the native oxide layer in direct contact; and
annealing the oxide layer and the native oxide layer.

19. The method according to claim 18, wherein preconditioning the surface of the native oxide layer comprises applying monosilane (SiH4) to the surface of the native oxide layer.

20. The method according to claim 18, further comprising:
applying water to the surface of the oxide layer or to the surface of the native oxide layer.

* * * * *